(12) United States Patent
Gass et al.

(10) Patent No.: US 7,930,617 B1
(45) Date of Patent: Apr. 19, 2011

(54) SLIDING WINDOW BLOCK CODES FOR CROSS-PACKET CODING

(75) Inventors: John H. Gass, Cedar Rapids, IA (US); James A. Stevens, Lucas, TX (US)

(73) Assignee: Rockwell Collins, Inc., Cedar Rapids, IA (US)

(*) Notice: Subject to any disclaimer, the term of this patent is extended or adjusted under 35 U.S.C. 154(b) by 972 days.

(21) Appl. No.: 11/820,572

(22) Filed: Jun. 20, 2007

(51) Int. Cl.
 *H03M 13/00* (2006.01)
(52) U.S. Cl. ........ 714/784; 714/756; 714/758; 714/776; 714/786; 714/799
(58) Field of Classification Search .................. 714/781, 714/784, 756, 786
See application file for complete search history.

(56) References Cited

U.S. PATENT DOCUMENTS

| | | | |
|---|---|---|---|
| 5,870,412 A | 2/1999 | Schuster | |
| 6,226,769 B1 * | 5/2001 | Schuster et al. | 714/752 |
| 6,449,746 B1 * | 9/2002 | Truong et al. | 714/784 |
| 6,994,478 B1 * | 2/2006 | Chiu et al. | 385/88 |
| 7,003,712 B2 * | 2/2006 | Martinian et al. | 714/761 |
| 7,139,960 B2 | 11/2006 | Shokrollahi | |
| 7,549,106 B2 * | 6/2009 | Maiuzzo | 714/755 |
| 7,551,556 B2 * | 6/2009 | Henriques et al. | 370/230 |
| 7,668,125 B2 * | 2/2010 | Kadous | 370/310 |
| 7,760,823 B2 * | 7/2010 | Priotti | 375/343 |

OTHER PUBLICATIONS

Byers, John W., "A Digital Fountain Approach to Asynchronous Reliable Multicast", IEEE Journal on Selected Areas in Communications, vol. 20, No. 8, Oct. 2002.
Martinian, Emin, "Burst Erasure Correction Codes with Low Decoding Delay", IEEE Transactions on Information Theory, vol. 50, No. 10, Oct. 2004.
Banerjee, Adrish, "Performance of hybrid ARQ schemes using turbo trellis coded modulation for wireless channels", Department of Electrical Engineering, University of Notre Dame, Notre Dame, IN 46556. pp. 1025-1029, Sep. 2000.

* cited by examiner

*Primary Examiner* — Esaw T Abraham
(74) *Attorney, Agent, or Firm* — Matthew J. Evans; Daniel M. Barbieri (57) ABSTRACT

A block-code-based structure that allows cross-packet coding of data using a sliding window. In this structure, each transmitted packet contains both information symbols and parity symbols generated by the information in previous packets. This code structure allows a receiver to recover lost packets without additional transmissions. If enough packets have been lost so that the receiver cannot recover one or more of them, new parity symbols can be generated and transmitted as additional packets. The parity symbols in these additional packets may be used by multiple receivers. Thus, the sliding window block code reduces retransmission overhead, particularly for multicast applications. Furthermore, the sliding window structure does not produce an encoding delay between the arrival of data and its transmission and reduces the decoding delay between the loss of a packet and its recovery.

8 Claims, 7 Drawing Sheets

FIG. 1
Transmitting Flow Diagram for Sliding Window Block Codes

(a) Correctable with RS code (b) Not correctable with SW code (c) Correctable with RS or SW code

| | Number of Destinations in Multicast | | |
|---|---|---|---|
| Code | 1 | 5 | 10 |
| SWB | 1.6 | 7.1 | 12.2 |
| RS | 1.1 | 5.0 | 9.3 |

FIG. 11

| Approach | Initial packets sent | Code rate | Number of retransmitted packets | Total packets sent | Coding overhead | Retransmission overhead | Total overhead |
|---|---|---|---|---|---|---|---|
| ARQ | 128 | 1 | 97.28 | 225.28 | 0 | 0.432 | 0.432 |
| DF | 128 | 1 | 20.6 | 148.6 | 0 | 0.139 | 0.139 |
| SWB | 128 | 0.75 | 12.2 | 140.2 | 0.228 | 0.087 | 0.315 |
| RS | 171 | 0.75 | 9.3 | 180.3 | 0.238 | 0.052 | 0.290 |

FIG. 12

| Approach | Encoding latency (packets) | Maximum decoding latency with no erasures (packets) | Maximum decoding latency with correctable erasures (packets) | Maximum decoding latency with uncorrectable erasures (packets) |
|---|---|---|---|---|
| ARQ | 1 | 1 | N/A | ≥ 2 + retransmission delay |
| DF | 128 | 128 | 128 + number of erasures | ≥ 129 + number of erasures + retransmission delay |
| SWB | 1 | 1 | 7 | ≥ 8 + retransmission delay |
| RS | 1 | 1 | 7 | ≥ 8 + retransmission delay |

FIG. 13

SLIDING WINDOW BLOCK CODES FOR CROSS-PACKET CODING

BACKGROUND OF THE INVENTION

1. Field of the Invention

The present invention relates generally to network coding techniques and more specifically to network coding techniques that allow receivers to recover lost packets, particularly in multicast applications, while minimizing overhead and latency.

2. Description of the Related Art

Introduction

It is desired to have network coding techniques that allow receivers to recover lost packets while minimizing overhead and latency. In particular, the coding techniques of interest should result in lower latency and overhead than digital fountain (DF) codes. Because information must be encoded across multiple packets, this coding is to be applied to messages that consist of streams of packets. The coding techniques should have the following properties:

1) The code should allow the receiver to recover a certain number of lost packets without requiring retransmissions.

2) The code should minimize ACKs and retransmissions in a multicast application. Transmission of additional parity packets allows multiple receivers to recover lost packets, rather than retransmitting each lost packet individually.

3) The code should be systematic, so that the receiver can process correctly received data without decoding delay.

4) The encoding latency should be low, so that the transmitter can send data without waiting to accumulate a large block.

5) The initial transmission of the message should have a high code rate, so that overhead is low.

6) Packets should be encoded using a sliding window, so that the decoding delay is minimized.

The first two criteria determine the performance of the code. Most medium access control protocols incur overhead to begin a transmission but do not incur significant overhead once the transmission is in progress. The ability of the code to correct packets with minimal extra transmissions and without retransmissions is an important consideration even in unicast applications. The other criteria determine the cost to the system in overhead and delay.

Background

The current approaches for this type of network encoding are to use erasure-correcting codes to encode a message block of information packets into a stream of encoded packets so that the original message block can be recovered from any set of K received encoded packets. DF codes are the best-known class of such codes. This structure can be used to reduce the number of retransmissions required to support reliable multicast. For example, suppose a source node transmits a group of K source packets to a set of destination nodes across independent wireless links. Each destination can lose a different set of transmitted packets. Suppose that the largest number of packets lost at any destination is E. With a DF code, the source only has to transmit E new encoded packets for the destinations to recover the entire message (assuming the second set of packets is received correctly). For conventional retransmission protocols, however, the source must retransmit every packet that has been lost by any destination.

The DF encoder requires a source node to store information packets until a complete message block is obtained before transmitting the encoded packets. This leads to latency at the source while packets accumulate. If the source node encodes and transmits packets as they arrive, rather than accumulating them, packet latency would be reduced. We refer to this method of encoding as a sliding window encoder. Furthermore, the sliding window encoder generates parity so that the information in lost packets can be recovered if enough subsequent packets within the window are received correctly. This reduces latency at the decoder. The DF decoder, on the other hand, does not guarantee recovery of any particular piece of information until the entire message has been recovered. As will be disclosed below, the present invention focuses on a high-rate sliding window FEC scheme with the ability to generate additional parity for retransmissions.

Alternative Considered Approaches

Since the network code must correct missing, rather than incorrect, packets, an erasure-correction code is suitable. All of the common error-control codes can correct erasures. Because erasures do not provide soft decisions, however, the advantages of conventional trellis-based codes are minimized. Block codes, such as Reed-Solomon (RS) codes, have therefore typically been used for erasure correction in past applications. Although systematic block codes allow for the immediate transmission of data symbols, an entire block of data must be accumulated before parity symbols can be generated. Trellis-based codes, by contrast, encode data using a sliding window.

A recent solution for providing erasure correction in multicast applications has been the use of DF codes. DF codes are explained in J. W. Byers, M. Luby, and M. Mitzenmacher, "A digital fountain approach to asynchronous reliable multicast," *IEEE J. Select. Areas Commun.*, vol. 20, pp. 1528-1540, October 2002. These codes are rateless block codes. The systematic and parity symbols to be sent are selected from a block of data using a random distribution. The advantages of DF codes are simplicity in encoding and decoding and a lack of a fixed rate. These codes introduce latency, however, because an entire message block must be accumulated before encoding begins. DF codes are not systematic.

Other block codes may also be used for multicast applications. Several papers addressing this are referenced in the Byers et. al. reference. For example, RS codes are systematic, so information symbols may be transmitted without latency, followed by a set of parity symbols to correct packet erasures. If too many packets are lost for the decoder to recover them, additional parity packets may be transmitted with further parity symbols from the codewords. Although these codes are not sliding window codes, a message can be divided into groups of data, each of which is encoded separately. The parity symbols then depend only on a limited window of data history that covers a particular codeword. Some block codes have drawbacks compared to DF codes. RS codes, for example, have limited block sizes and require significantly more processing for encoding and decoding.

Block codes can be adapted so that data is encoded with a sliding window. (The resulting structure is theoretically equivalent to a convolutional code.) This approach will be referred to as a sliding window block (SWB) code. For example, parity symbols may be generated based on a set of the most recent information symbols. One such family of codes, maximally short (MS) codes, is defined in E. Martinian and C.-E. W. Sundberg, "Burst erasure correction codes with low decoding delay," *IEEE Trans. Inform. Theory*, vol. 50, pp. 2494-2502, October 2004. The codes in the Martinian et. al. reference are designed to correct bursts of erasures. These codes do not, however, produce parity symbols suitable for multicast retransmissions. Similar constructions can generate codes for more general erasure patterns. These types of codes are systematic sliding window codes with low latency but may be complex to implement.

Convolutional codes provide fast encoding with a sliding window. Conventional convolutional decoders, however, can have large decoding delays. One method of producing packets for retransmission is to use a punctured convolutional code for the initial multicast. The punctured symbols can then be sent to correct erasures. If different receivers have lost different packets, however, different punctured symbols may be required to correct the different error paths in the decoder trellis. Maintaining the decoder trellis may also require significant processing and memory. The structure of convolutional codes is not as compatible with the desired application as the structure of block codes.

Turbo codes have been proposed for hybrid ARQ transmission protocols as illustrated in A. Banerjee, D. J. Costello Jr., and T. E. Fuja, "Performance of hybrid ARQ schemes using turbo trellis coded modulation for wireless channels," in *Proc. 2000 IEEE Wireless Commun. and Networking Conf.*, vol. 3, pp. 1025-1029, September 2000. Turbo codes, however, are typically used with large blocks of data. The information symbols may be transmitted immediately to reduce latency, but the number of parity symbols may be relatively large unless a high-rate turbo code is used. Turbo decoding also requires significant processing. Soft decisions must be generated by a decoder for each packet, and these decisions must be retained to process retransmissions. This approach is more suitable for augmenting the error-correction capability of individual packets rather than for recovering lost packets.

SUMMARY OF THE INVENTION

In a broad aspect, the present invention is a method for communicating information symbols in a digital communications system. A stream of information symbols is divided into a sequence of information segments, each of which contains k symbols, the k symbols in the ith segment being denoted $x_0[i], x_1[i], \ldots, x_{k-1}[i]$. A set of e parity symbols is generated associated with each information segment, where e is greater than one, where the mth parity symbol in the set associated with the ith segment is generated utilizing the following steps:

i) selecting a set of W=kL information symbols $\{x_j[i-j-m-1], x_j[i-j-m-1-k], \ldots, x_j[i-j-m-1-k(L-1)]\}$, where j=0, 1, ..., k−1 and W is a defined window length and is a multiple of k;

ii) generating a codeword from the set of information symbols utilizing a systematic block code, where the block code can correct more than one erased symbol; and, iii) selecting the mth parity symbol from the codeword, where the parity symbol is denoted as $P_m[i-m-1]$, to be the mth parity symbol associated with the ith information segment.

Each of the information segments and its associated set of parity symbols are assembled into a sequence of packets, each of the packets comprising an information segment and its associated set of parity symbols. The sequence of packets is transmitted to at least one receiver.

This invention allows a receiver to recover a defined number of lost packets without requiring additional packet transmissions, which reduces transmission overhead compared to standard ARQ approaches. The invention provides a mechanism to transmit additional packets when necessary, where such packets can be used to recover previous lost packets by multiple receivers. The invention does not require encoding latency and requires less decoding latency than other approaches, such as digital fountain codes.

DETAILED DESCRIPTION OF THE INVENTION

Figure 1:
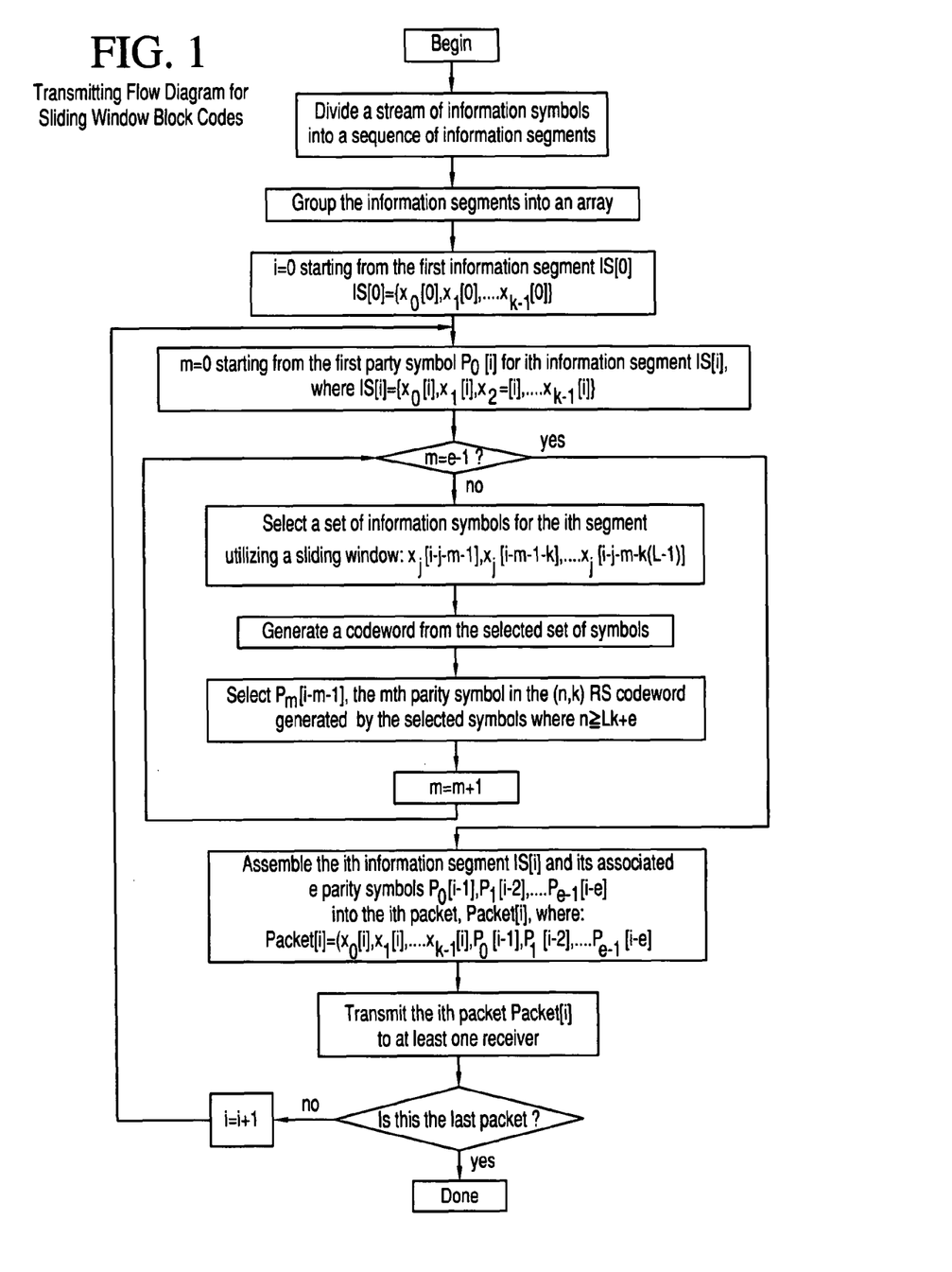
FIG. 1 is a transmitting flow diagram for sliding window block codes in accordance with the principles of the present invention.

Referring now to FIG. 1, a preferred embodiment of a method for communicating information symbols in a digital communications system in accordance with the principles of the present invention is illustrated. First of all, a transmitter divides a stream of information symbols into a sequence of information segments, each of which contains k symbols. The ith information segment is denoted as IS[i], and the k symbols in the ith information segment are denoted as $x_0[i], x_1[i], \ldots, x_{k-1}[i]$, where $IS[i]=\{x_0[i], x_1[i], \ldots, x_{k-1}[i]\}$ The transmitter groups the information segments into a 2D array. One of the 2D array indices is the index of the information segment, denoted as i. The other index of the 2D array indices is the index of symbols in the information segment, denoted as j.

The transmitter generates a set of e parity symbols associated with each information segment, where e is greater than one. The index of e parity symbols is denoted as m. The mth parity symbol in the set associated with the ith information segment IS[i], being denoted as $P_m[i-m-1]$, is generated utilizing the following steps:

a) selecting a set of W=kL information symbols $\{x_j[i-j-m-1], x_j[i-j-m-1-k], \ldots, x_j[i-j-m-1-k(L-1)]\}$, where j=0, 1, ..., k−1 and W is a defined window length and is a multiple of k;

b) generating a codeword from the set of information symbols utilizing a systematic block code, where the block code can correct e erased symbols; and, c) selecting the mth parity symbol $P_m[i-m-1]$ in the systematic codeword generated by the selected symbols.

d) increasing m with one increment and repeating steps a), b) and c) until all e parity symbols are generated.

The transmitter assembles the ith information segment IS[i] and its associated e parity symbols, $P_0[i-1]$, $P_1[i-2]$, ..., $P_{e-1}[i-e]$ into the ith packet. The ith packet is denoted as Packet[i], where Packet[i]={$x_0[i]$, $x_1[i]$, ..., $P_0[i-1]$, $P_1[i-2]$, ..., $P_{e-1}[i-e]$}.

The transmitter transmits the ith Packet[i] to at least one receiver.

The transmitter repeats the previous steps until all the information segments have been transmitted.

At the end of an information stream, additional packets containing only parity symbols must be transmitted to provide erasure protection for the information in the last few packets of the information stream.

In a preferred embodiment, L is set to one and the parity symbols are generated using a window length equal to k and utilizing a systematic block code comprises encoding k information symbols with an (n, k) Reed-Solomon code, where n is greater than or equal to k+e. Note that only e of the n–k parity symbols are transmitted. The remaining parity symbols are retained by the transmitter for possible use in retransmission.

It is important to notice that the ith codeword is generated by k information symbols transmitted in k different packets and includes parity symbols transmitted in an additional e packets. Thus, if a packet is lost, its information symbols can be recovered individually by decoding the appropriate set of codewords. A codeword can be decoded if k of its symbols have been received. If the information segments of packets prior to the ith packet have been received, and the ith packet is lost in transmission, and fewer than e of the subsequent k+e–1 packets are lost in transmission, the receiver reconstructs the information segment associated with the ith packet utilizing the following steps:

a) initializing index j with a value of zero;
b) recovering information symbol $x_j[i]$, after the (i+j+e)th packet has been sent utilizing the codeword symbols received from the set {$P_{e-1}[i+j]$, ..., $P_1[i+j]$, $P_0[i+j]$, $x_0[i+j]$, $x_1[i+j-1]$, ..., $x_{k-1}[i+j-k+1]$, $x_0[i+j-k]$, $x_1[i+j-k-1]$, ..., $x_{k-1}[i+j-2k+1]$, ..., $x_0[i+j-k(L-1)]$, $x_1[i+j-k(L-1)-1]$, ..., $x_{k-1}[i+j-kL+1]$}, which are transmitted in the (i+j+e)th, (i+j+e–1)th, ..., and (i+j–kL+1)th packets, respectively;
c) repeating step b) to recover information symbols $x_j[i]$, j=1, 2, ..., k–1, so that the information segment in the packet i is recovered after packet i+k+e–1 has been sent.

When generating a set of parity symbols, the transmitter also generates parity symbols $P_e[i-e-1]$, $P_{e+1}[i-e-2]$, ..., $P_{e+r}[i-e-r]$, where $P_m[i]$ denotes the mth parity symbol in the codeword generated by information symbols {$x_j[i-j]$, $x_j[i-j-k]$, ..., $x_j[i-j-k(L-1)]$}, where j=0, 1, ..., k–1 and, r is a constant such that the systematic block code can correct e+r erased symbols. The parity symbols $P_e[i-e-1]$, $P_{e+1}[i-e-2]$, ..., $P_{e+r}[i-e-r]$ are stored at the transmitter for a specified time period.

If too many packet erasures occur, the receiver requests an additional parity packet, which is referred to as a retransmission, consisting entirely of parity symbols. This packet, if received correctly, allows the receiver to recover the information symbols in a previously lost packet. The receiver requests a retransmission as soon as the decoder of the receiver determines that a codeword is not correctable. If the ith codeword is not correctable, the parity packet consists of the parity symbols $P_e[i]$, $P_e[i+1]$, ..., $P_e[i+q]$. If q=k+e–1, the parity packet consists of k+e symbols, the same number as in the original packets. The parity packet provides an additional parity symbol for codewords i through i+q, so that the decoder of the receiver can correct an additional erasure in each of these codewords. If further retransmissions are needed to decode any of the codewords from i to i+q, further packets with additional parity symbols from each codeword are sent (e.g., $P_{e+1}[i]$, $P_{e+1}[i+1]$, ..., $P_{e+1}[i+q]$). Because the parity packet contains parity symbols that are not in the original transmission, other receivers can use it to recover lost information symbols encoded in the parity packet, reducing the need for further retransmissions.

If the information segments of packets prior to the ith packet have been received, and the ith packet Packet[i] is lost in transmission, the receiver reconstructs the information segment associated with the ith packet utilizing the following steps:

a) initializing the index j with a value of zero, where j is the index of information symbol of the information segment;
b) attempting to recover the jth information symbol $x_j[i]$ after the (i+j+e)th packet has been sent, utilizing the codeword symbols received from the set {$P_{e-1}[i+j]$, ..., $P_1[i+j]$, $P_0[i+j]$, $x_0[i+j]$, $x_1[i+j-1]$, ..., $x_{k-1}[i+j-k+1]$, $x_0[i+j-k]$, $x_1[i+j-k-1]$, ..., $x_{k-1}[i+j-2k+1]$, ..., $x_0[i+j-k(L-1)]$, $x_1[i+j-k(L-1)-1]$, ..., $x_{k-1}[i+j-kL+1]$}, which are transmitted in the (i+j+e)th, (i+j+e–1)th, ..., and (i+j–kL+1)th packets, respectively, and any of the codeword symbols $P_e[i+j]$, $P_{e+1}[i+j]$, ..., $P_{e+r}[i+j]$ which have been received;
c) if the information symbol $x_j[i]$ is recovered, the index j is incremented, with a maximum value of k–1, and the receiver repeats step (b) using the new value of j;
d) if the information symbol $x_j[i]$ is not recovered, the receiver initiates a process comprising the following steps:
  i) communicating a request from the receiver to the transmitter for additional parity symbols, where the request indicates the values of j and i;
  ii) communicating a packet from the transmitter to the receiver and to all other receivers that are receiving the stream of information symbols, where the packet contains the parity symbols $P_m[i+j]$, $P_m[i+j+1]$, ..., $P_m[i+j+q]$, where q is a defined constant which determines the size of the packet and m is the smallest index greater than e–1 and less than e+r+1 for which $P_m[i+j]$ has not been previously transmitted;
  iii) if the transmitter has already transmitted parity symbol $P_{e+r}[i+j]$, no additional parity symbols are transmitted, and the ith information segment is not recovered by the receiver;
  iv) if the packet is received by the receiver, the receiver retains the parity symbols received in the packet and repeats step b; and,
  v) if the packet is not received by the receiver, the receiver repeats step i).

In practice, the transmitted packets may contain more than k+e symbols. These larger packets would then consist of multiple sets of these information and parity symbols. Each set is encoded and decoded separately.

When the transmitter needs to communicate N such information streams to at least one receiver, it alternately transmits packets from each stream.

Figure 2:
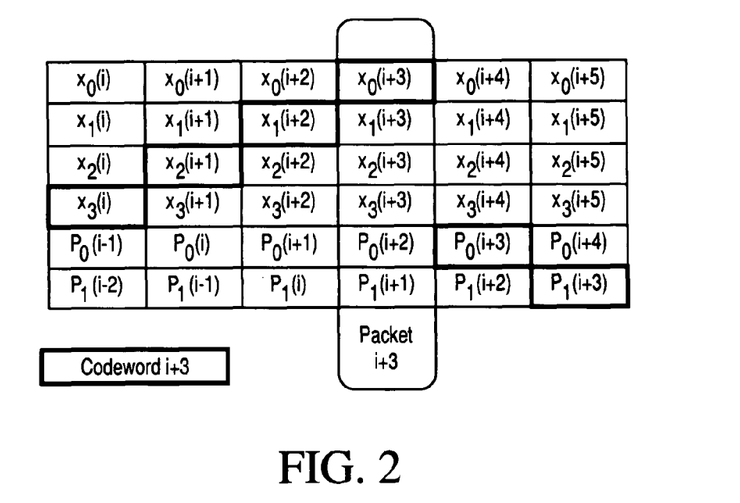
FIG. 2 illustrates a relationship between packets and codewords for an SWB code with k=4 and e=2.

Now referring to FIG. 2, a relationship between packets and codewords for a sliding window block codes with L=1, k=4 and e=2 is illustrated. Every information segment has four symbols. The information segment IS[i+3] is {$x_0[i+3]$, $x_1[i+3]$, $x_2[i+3]$, $x_3[i+3]$}. Every set of parity symbols contains two parity symbols. The information symbols selected for generating parity symbols $P_0[i+3]$ and $P_1[i+3]$ are $x_0[i+3]$, $x_1[i+2]$, $x_2[i+1]$, and $x_3[i]$. The (i+3)th codeword is $\{x_3[i], x_2[i+1], x_1[i+2], x_0[i+3], P_0[i+3], P_1[i+3]\}$. Each column represents a packet. The packet[i+3] is $\{x_0[i+3], x_1[i+3], x_2[i+3], x_3[i+3], P_0[i+2], P_1[i+1]\}$. As the index of packet i increases, the index of the codeword i increases accordingly.

Figure 3:
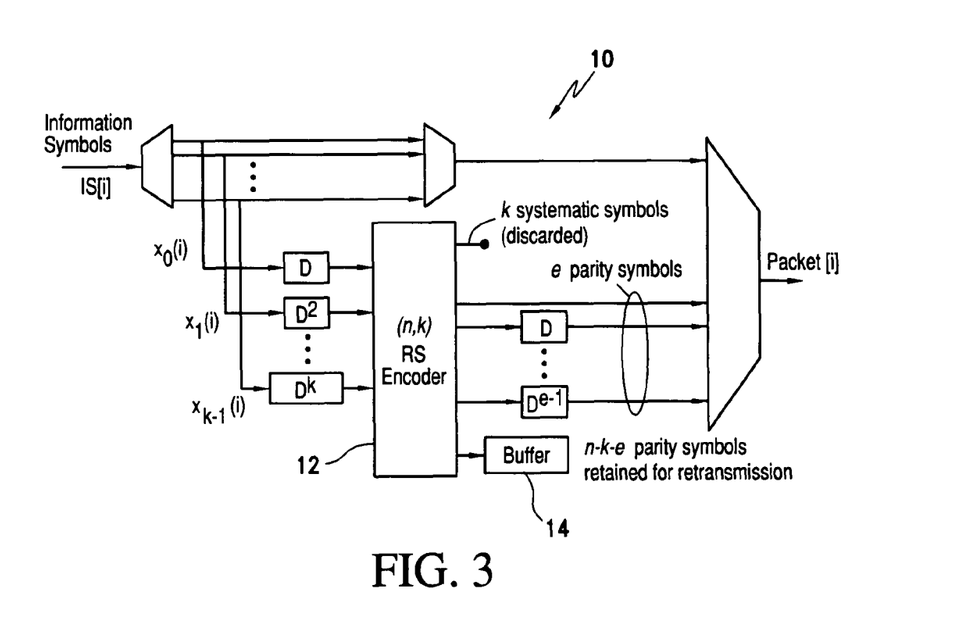
FIG. 3 is a block diagram of an encoder for SWB code in accordance with the principles of the present invention.

Now referring to FIG. 3, an encoder for sliding window block codes in accordance with the principles of the present invention is illustrated for the case of L=1, designated generally as 10. The information symbols from each information segment IS[i] are assembled into Packet[i], as well as being sent to an (n, k) RS encoder 12 to generate parity symbols. The symbols at the inputs and outputs of the encoder are delayed by packet increments, indicated by delay D, so that the parity symbols associated with Packet[i] are generated by the appropriate information symbols indicated in FIG. 1. A buffer 14 is used to retain n−k−e parity symbols for retransmission. The k systematic symbols generated by the encoder 12 are discarded.

Figure 4:
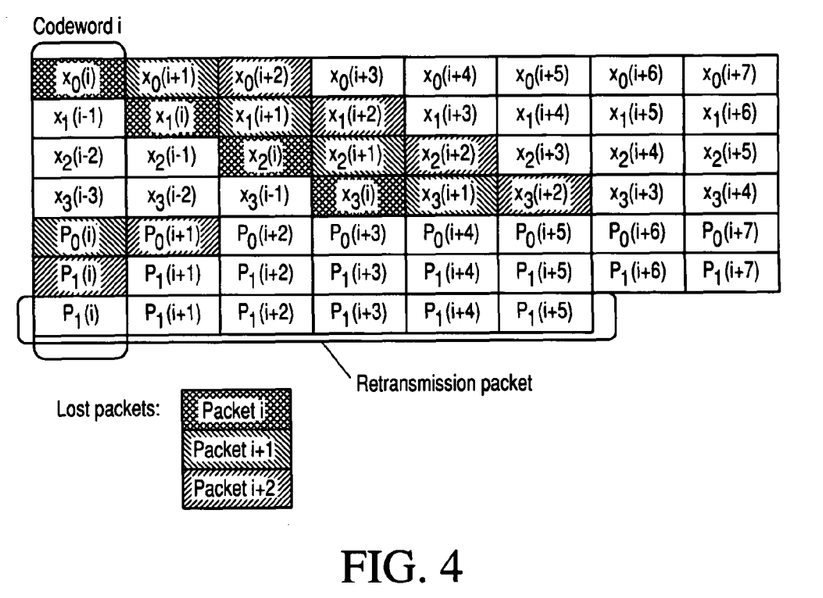
FIG. 4 illustrates an effect of a retransmission packet on decoding.

Now referring to FIG. 4, the effect of a retransmission packet on decoding with k=4 and e=2 is illustrated. Each column represents a codeword, and the information symbols that correspond to the ith, (i+1)th and (i+2)th packets are shaded as designated in the Figure. The ith packet (vertical hatching) is, Packet[i+1]=$\{x_0[i], x_1[i], x_2[i], x_3[i]\}$. The (i+1) th packet (first direction diagonal hatching) is, Packet[i+1]= $\{x_0[i+1], x_1[i+1], x_2[i+1], x_3[i+1], P_0[i]\}$. The (i+2)th packet (second direction diagonal hatching) is, Packet[i+2]=$\{x_0[i+2], x_1[i+2], x_2[i+2], x_3[i+2], P_0[i+1], P_1[i]\}$. Because two packets are lost after the ith packet, and the code can only correct two erasures within the decoding window, all of the information symbols in the ith packet, as well as some information symbols in the (i+1)th and (i+2)th packets, cannot be recovered. A retransmission is therefore requested that contains additional parity symbols from the ith through (i+k−1)th codewords so that these information symbols can be recovered. Additional parity symbols for the (i+k)th to (i+k+e−1)th codewords are also included in the retransmission. These parity symbols are only used if additional packets are lost.

The effect of implementing a sliding window block code with a value of L greater than one is to increase the acceptable delay and generate each codeword using information symbols from overlapping windows. The Reed-Solomon code that generates the codewords must then be augmented as compared to the code used for the case of L=1. For example, parity symbol $P_m[i]$ can be redefined as the mth parity symbol in the (n,Lk) RS codeword generated by the information symbols $x_0[i], x_1[i-1], \ldots, x_{k-1}[i-k+1], x_0[i-k], x_1[i-k-1], \ldots, x_{m-e}[i-2k+1], \ldots, x_0[i-(L-1)k], x_1[i-(L-1)k-1], \ldots, x_{m-e}[i-Lk+1]$. Note that the code rate of the SWB code remains equal to k/(k+e), but the information symbols in the codeword are now drawn from a window L times as long. Also, each information symbol is encoded in L codewords. For example, $x_0[i]$ is encoded in the ith, (i+k)th, . . . , and (i+(L−1)k)th codewords. The augmented code can correct the same erasure patterns as the unaugmented code. In addition, other erasure patterns may be correctable if enough packets are received correctly after an uncorrectable event, because each information symbol is encoded in two different codewords. If more than e packets are lost within a span of k packets, an uncorrectable number of erasures occurs in both of the codewords for at least one information symbol even if every other packet is received correctly. Thus, the additional correction capability is limited. This approach increases the number of erasure patterns that can be corrected, but also increases the maximum decoding delay and requires iterative decoding. That is, if a codeword cannot be decoded, the receiver must retain it and attempt to decode it again when further information is received. Quantitative performance results have not been obtained for codes with L greater than one.

Figure 5:
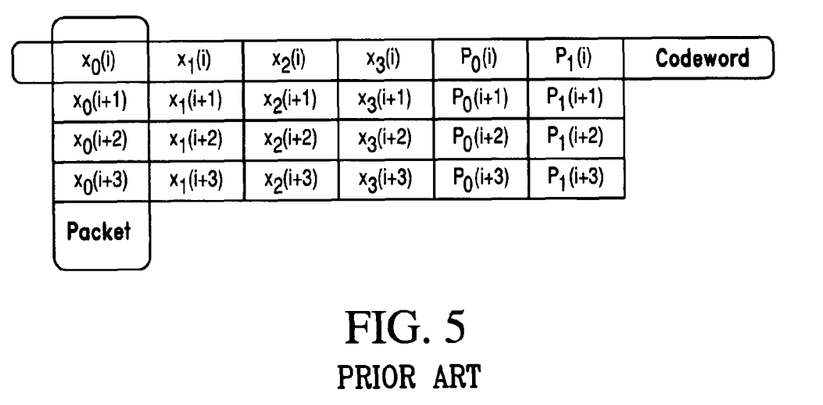
FIG. 5 (Prior Art) illustrates a relationship between packets and codewords for an RS code with k=4 and e=2.

For performance comparisons, a straightforward application of Reed-Solomon codes is considered. A transmitter sends a group of k information packets without delay, each consisting of the k information symbols from a particular information segment, followed by a group of e parity packets, each consisting of k parity symbols generated by an (n, k) RS code. Each packet is shorter than the packets used with the sliding window block code, which may require more packet transmissions for a given number of information segments. Referring now to FIG. 5, the relationship between packets and codeword for an RS code with e=2 and k=4 is illustrated. For this scheme, parity symbol $P_j[i]$ is the jth parity symbol in the (n,k) RS codeword generated by the information symbols $x_0[i], x_1[i], \ldots, x_{k-1}[i]$, where n≧k+e. Every row represents a codeword. The ith codeword is $\{x_0[i], x_1[i], x_2[i], x_3[i], P_0[i], P_1[i]\}$. Each column represents a packet. The transmitter sends four information symbol packets without delay, then it sends two parity symbol packets, where the four information packets are $\{x_0[i], x_0[i+1], x_0[i+2], x_0[i+3]\}, \{x_1[i+1], x_1[i+2], x_1[i-3]\}, \{x_2[i], x_2[i+1], x_2[i+2], x_2[i+3]\}, \{x_3[i], x_3[i+1], x_3[i+2], x_3[i+3]\}$, respectively, and the two parity symbol packets are $\{P_0[i], P_0[i+1], P_0[i+2], P_0[i+3]\}, \{P_1[i], P_1[i+1], P_1[i+2], P_1[i+3]\}$, respectively. As long as k of the total k+e packets are received correctly, all of the information symbols can be recovered. Like the sliding window block code, the maximum decoding delay is k+e−1 packets.

Figure 6:
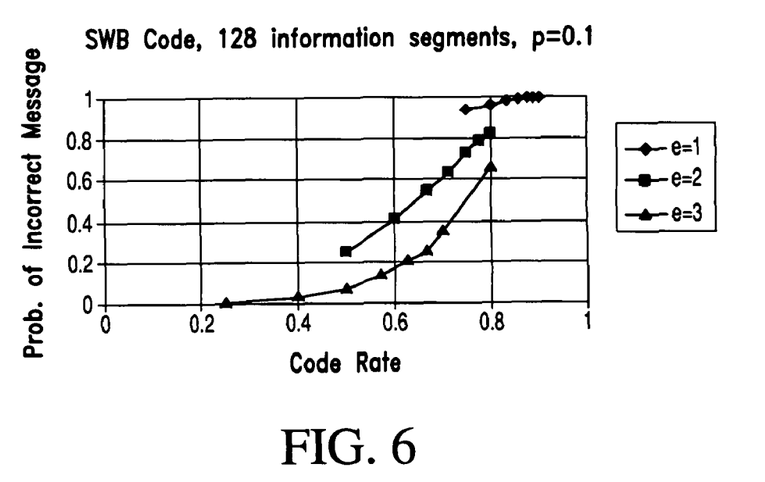
FIG. 6 illustrates the performances of a SWB code for a 128-segment message and a packet loss rate of 10%.
Figure 7:
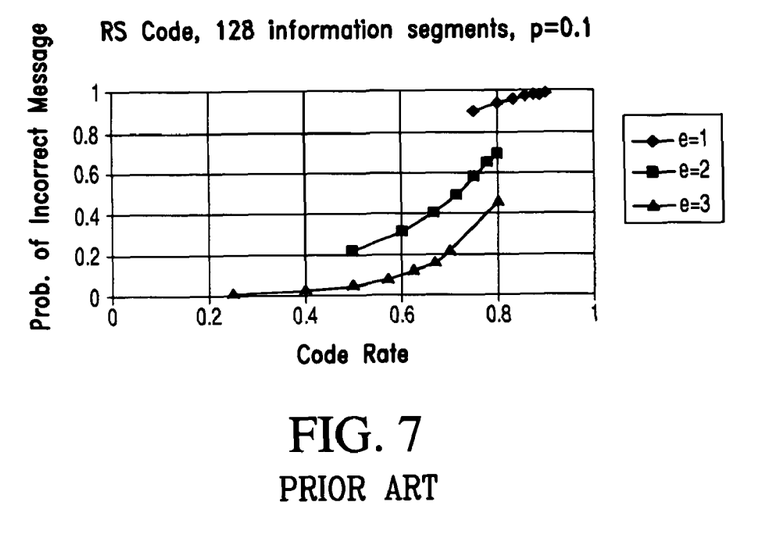
FIG. 7 (Prior Art) illustrates the performances of an RS code for a 128-segment message and a packet loss rate of 10%.
Figure 8:
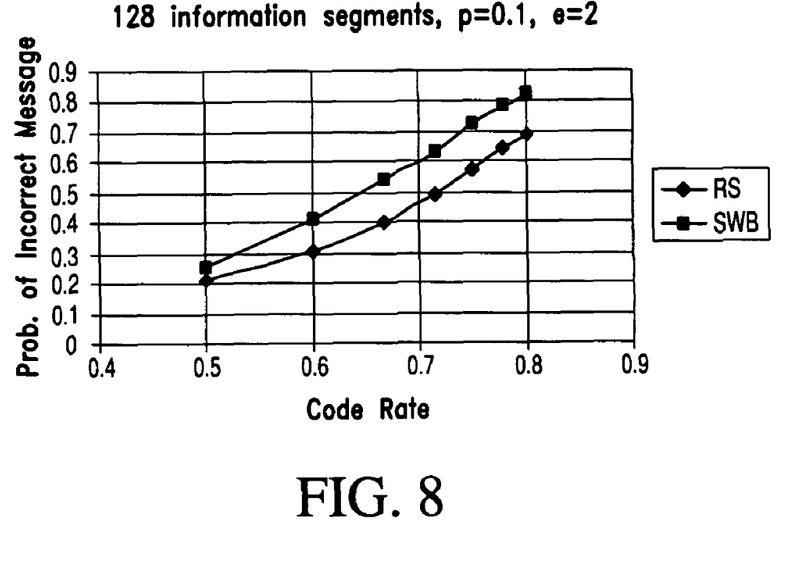
FIG. 8 illustrates a comparison of the performances of SWB and RS codes with e=2 for a 128-segment message and a packet loss rate of 10%.
Figure 9:
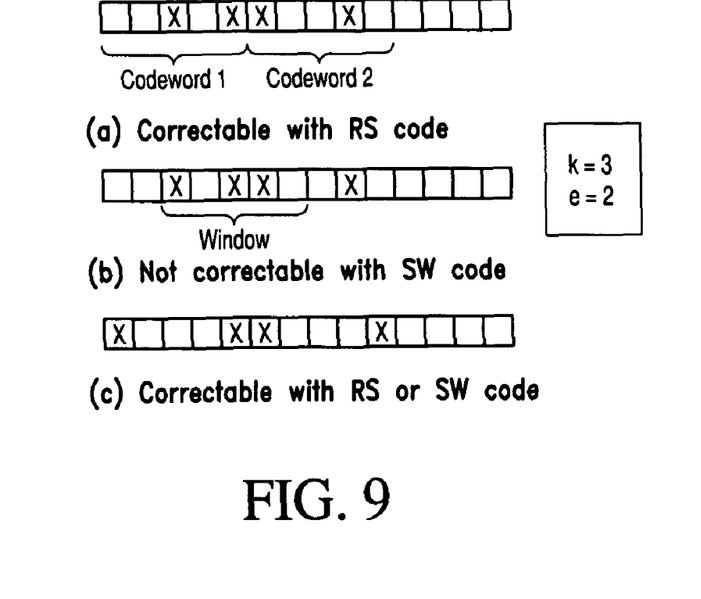
FIG. 9 illustrates correctable and uncorrectable erasure patterns for RS and SWB codes.

The probability of correct reception of a message of 128 information segments was computed for the SWB and RS codes for a range of values of m and the probability of packet loss. For a 128-segment message and a packet loss rate of 10%, the performance of the SWB and RS codes are shown in FIG. 6 and FIG. 7, respectively. For a given code rate, a higher erasure-correction capability e produces a lower probability of message loss and a larger maximum decoding delay k+e−1 (e.g., a code rate of 0.8 results from e=1, k=4 or e=2, k=8). The comparison of the performance of SWB and RS codes with e=2, L=1, and a 128-segment message and packet loss rate of 10% is illustrated in FIG. 8. The RS code performs better than the SWB code. The reason for that is the RS code can correct some erasure patterns that the SWB code cannot. If more than e erasures occur during a span of k+e packets, the SWB code cannot correct them. If the erasures fall into different RS codewords, however, the RS code can correct them. Examples of correctable and uncorrectable erasure patterns for RS and SWB codes are illustrated in FIG. 9.

Figure 10:
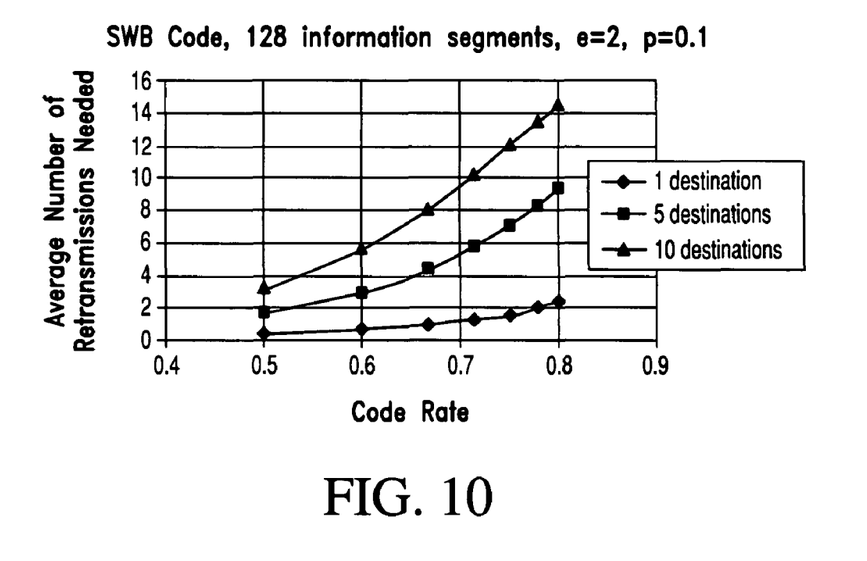
FIG. 10 illustrates the average required number of retransmissions for an SWB code with e=2 for a 128-segment message and a packet loss rate of 10%.
Figure 11:
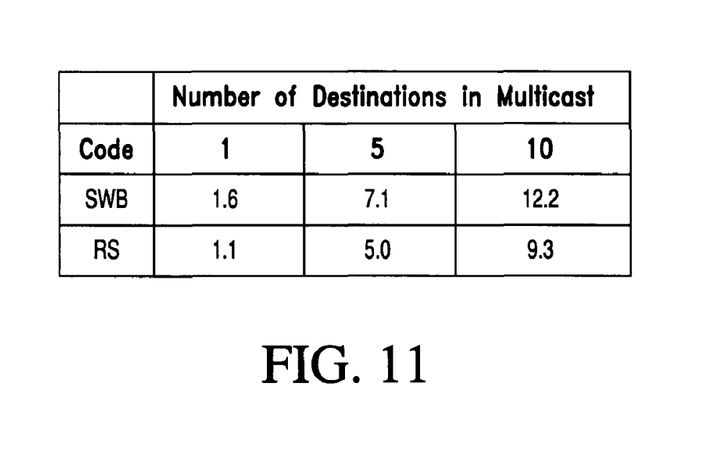
FIG. 11 illustrates the average number of retransmissions for SWB and RS codes with e=2, k=6, message length of 128 information segments, and packet loss rate of 10%.

The average number of retransmissions required for correct reception of a multicast message was also simulated. Required number of retransmission for an SWB code with e=2 and L=1 for a 128-segment message and packet loss rate of 10% is illustrated in FIG. 10. Data comparing the number of required retransmissions for rate-¾ SWB and RS codes is shown in FIG. 11 for specific cases. The additional erasure-correction capability of the RS code results in a reduction of the average number of transmissions.

Figure 12:
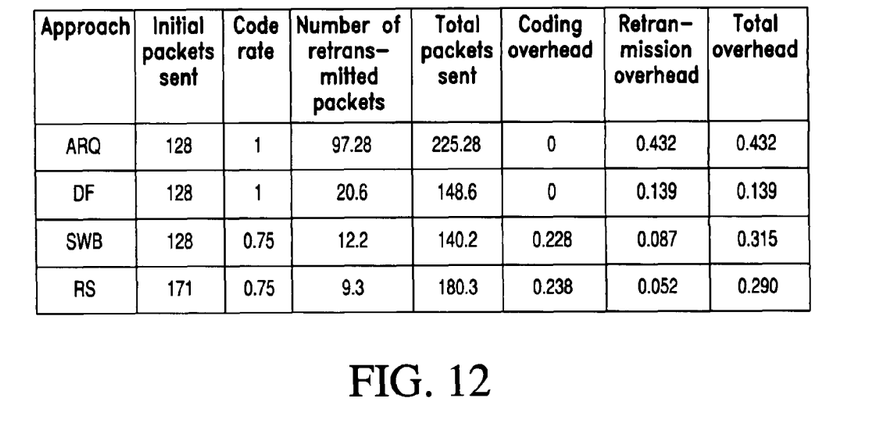
FIG. 12 illustrates a comparison of overhead for different erasure-control schemes with k=6, e=2, packet loss rate of 10%, and 10 destinations.

For purposes of comparison with other techniques, a multicast transmission of 128 information segments to 10 destinations with a packet loss rate of 10% is considered. For a standard retransmission (ARQ) protocol, in which overhead consists entirely of retransmissions of lost packets, approximately 1.76 transmissions are required for successful reception of each packet. For a digital fountain code, an average of 20.6 extra transmissions are needed for successful reception of all information symbols, yielding an overhead rate of 13.9% relative to the total number of transmissions. The overhead in the DF code can consist of either retransmissions or a set number of redundant packets that are transmitted without an exhange of NAKs. For a rate-¾, e=2, L=1 SWB code, this scenario requires an average of 12.2 retransmissions, for a total overhead rate of 31.5%. For a rate-¾, e=2 RS code, this scenario requires an average of 9.3 retransmissions, for a total overhead rate of 29.0%. The comparison of overhead for different erasure-control schemes with k=6, e=2, packet loss rate of 10%, and 10 destinations is illustrated in FIG. 12, where the overhead is the fraction of the total transmission time that consists of retransmissions and parity symbols. The number of transmitted information segments is assumed to be 128. Transmitted packets using SWB coding have k+e symbols each, while packets using ARQ, DF, and RS codes have k symbols each. The overhead of the SWB and RS codes is roughly twice the overhead of the DF code. Their overhead is roughly 75% of that of the standard retransmission protocol, however. Furthermore, the SWB and RS overhead consists primarily of transmitted parity, rather than retransmissions, which are less desirable. The SWB code is preferable to the RS code because it requires fewer transmissions with nearly the same overhead.

Figure 13:
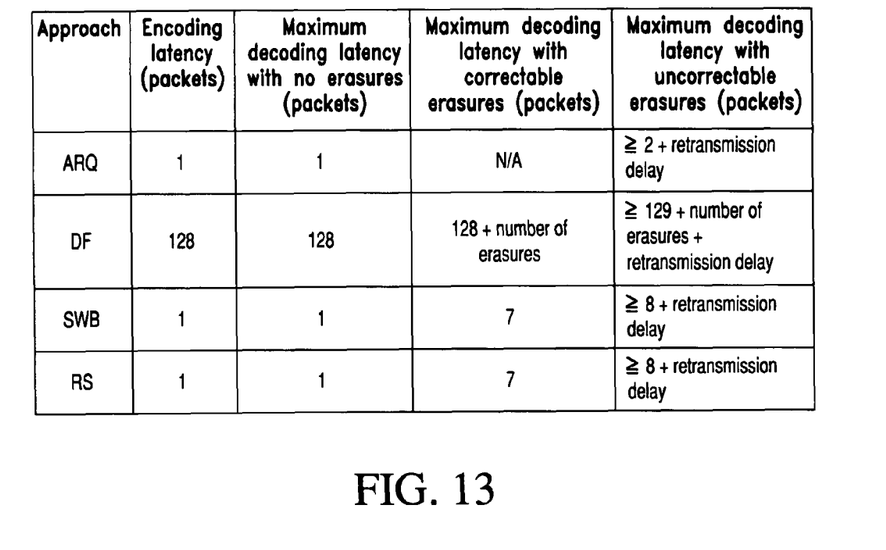
FIG. 13 illustrates a comparison of latency for different erasure-control schemes with k=6 and e=2 for a message of length 128k symbols.

The comparison of latency for different erasure-control schemes with k=6 and e=2 for a message of length 128k symbols is illustrated in FIG. 13. The maximum decoding latencies in the FIG. 13 are for information symbols that can be recovered both with and without retransmissions. The maximum latency with retransmissions depends on both the protocol, which is assumed to require NAKs, and the likelihood that retransmissions are lost. The numerical values in the table assume that retransmissions are received correctly. The ARQ scheme introduces no decoding latency, but retransmission delays can occur frequently. The DF code introduces large delays both at the encoder and decoder. The maximum decoding latency for the SWB and RS is relatively small.

In summary, the present invention allows a receiver to recover a defined number of lost packets with low latency and also provides a mechanism for sending useful multicast parity symbols if retransmissions are needed. Augmenting the SWB code by using larger values of L can improve its performance but would increase the maximum decoding delay and require more processing in the decoder. The SWB codes require higher overhead than DF codes, but they can be used with shorter messages and do not require large delays at either the encoder or decoder.

Other embodiments and configurations may be devised without departing from the spirit of the invention and the scope of the appended claims.

The invention claimed is:

1. A method for communicating information symbols in a digital communications system, comprising the steps of:
   a) dividing a stream of information symbols into a sequence of information segments, each of which contains k symbols, the k symbols in the ith segment being denoted $x_0[i], x_1[i], \ldots, x_{k-1}[i]$;
   b) generating a set of e parity symbols associated with each information segment, where e is greater than one, where the mth parity symbol in said set associated with the ith segment is generated utilizing the following steps:
      i. selecting a set of W=kL information symbols $\{x_j[i-j-m-1], x_j[i-j-m-1-k], \ldots, x_j[i-j-m-1-k(L-1)]\}$, where $j=0, 1, \ldots, k-1$ and W is a defined window length and is a multiple of k and L is positive integer;
      ii. generating a codeword from said set of information symbols utilizing a systematic block code, where said block code corrects more than one erased symbol; and,
      iii. selecting the mth parity symbol from said codeword, where said parity symbol is denoted as $P_m[i-m-1]$, to be the mth parity symbol associated with the ith information segment;
   c) assembling each of said information segments and its associated set of parity symbols into a sequence of packets, each of said packets comprising an information segment and its associated set of parity symbols; and,
   d) transmitting said sequence of packets to at least one receiver.

2. The method of claim 1 wherein said parity symbols are generated using a window length W equal to k.

3. The method of claim 1 wherein:
   said step of generating a set of e parity symbols for each said information segment utilizing a systematic block code comprises encoding k information symbols with a (kL+e, kL) Reed-Solomon code.

4. The method of claim 1 wherein:
   if the information segments of packets prior to the ith packet have been received, and the ith packet is lost in transmission, and fewer than e of the subsequent k+e−1 packets are lost in transmission, said receiver reconstructs the information segment associated with the ith packet by steps comprising:
   a) initializing the index j with a value of zero;
   b) recovering information symbol $x_j[i]$, after the (i+j+e)th packet has been sent, utilizing the codeword symbols received from the set $\{P_{e-1}[i+j], \ldots, P_1[i+j], P_0[i+j], x_0[i+j], x_1[i+j-1], \ldots, x_{k-1}[i+j-k+1], x_0[i+j-k], x_1[i+j-k-1], \ldots, x_{k-1}[i+j-2k+1], \ldots, x_0[i+j-k(L-1)], x_1[i+j-k(L-1)-1], \ldots, x_{k-1}[i+j-kL+1]\}$, which are transmitted in the (i+j+e)th, (i+j+e−1)th, ..., and (i+j−kL+1)th packets, respectively;
   c) repeating step (a) to recover information symbols $x_j[i], j=1, 2, \ldots, k-1$, so that the information segment associated with packet i is recovered after packet i+k+e−1 has been sent.

5. The method of claim 1 wherein:
   a) said step of generating a set of parity symbols also includes the generation of parity symbols $P_e[i-e-1], P_{e+1}[i-e-2], \ldots, P_{e+r}[i-e-r]$, where $P_m[i]$ denotes the mth parity symbol in the codeword generated by information symbols $\{x_j[i-j], x_j[i-j-k], \ldots, x_j[i-j-k(L-1)]\}$, where $j=0, 1, \ldots, k-1$, r is a constant such that said systematic block code can correct e+r erased symbols, and W=kL is a defined window length;
   b) said parity symbols $P_e[i-e-1], P_{e-1}[i-e-2], \ldots, P_{e+r}[i-e-r]$ are stored at a transmitter for a specified time period.

6. The method of claim 5 wherein:
   if the information segments of packets prior to the ith packet have been received, and the ith packet is lost in transmission, said receiver reconstructs the information segment associated with the ith packet by steps comprising:
   a) initializing the index j with a value of zero;
   b) attempting to recover information symbol $x_j[i]$ after the (i+j+e)th packet has been sent, utilizing the codeword symbols received from the set $\{P_{e-1}[i+j], \ldots, P_1[i+j], P_0[i+j], x_0[i+j], x_1[i+j-1], \ldots, x_{k-1}[i+j-k+1], x_0[i+j-k], x_1[i+j-k-1], \ldots, x_{k-1}[i+j-2k+1], \ldots, x_0[i+j-k(L-1)], x_1[i+j-k(L-1)-1], \ldots, x_{k-1}[i+j-kL+1]\}$, which are transmitted in the (i+j+e)th, (i+j+e−1)

th, ..., and (i+j−kL+1)th packets, respectively, and any of the codeword symbols $P_e[i+j]$, $P_{e+1}[i+j]$, ..., $P_{e+r}[i+j]$ which have been received;

c) if said information symbol $x_j[i]$ is recovered, the index j is incremented, with a maximum value of k−1, and the receiver repeats step (b) using the new value of j;

d) if said information symbol $x_j[i]$ is not recovered, said receiver initiates a process of steps comprising:
   i. communicating a request from said receiver to said transmitter for additional parity symbols, where said request indicates the values of j and i;
   ii. communicating a packet from said transmitter to said receiver and to all other receivers that are receiving said stream of information symbols, where said packet contains the parity symbols $P_m[i+j]$, $P_m[i+j+1]$, ..., $P_m[i+j+q]$, where q is a defined constant which determines the size of said packet and m is the smallest index greater than e−1 and less than e+r+1 for which $P_m[i+j]$ has not been previously transmitted;
   iii. if said transmitter has already transmitted parity symbol $P_{e+r}[i+j]$, no additional parity symbols are transmitted, and the ith information segment is not recovered by said receiver;
   iv. if said packet is received by said receiver, said receiver retains the parity symbols received in said packet and repeats step (b);
   v. if said packet is not received by said receiver, said receiver repeats step (i).

7. The method of claim 1 wherein said transmitter communicates N such streams of information symbols to at least one receiver by alternately transmitting packets from each stream.

8. A digital communications system, comprising:

a) means for dividing a stream of information symbols into a sequence of information segments, each of which contains k symbols, the k symbols in the ith segment being denoted $x_0[i]$, $x_1[i]$, ..., $x_{k-1}[i]$;

b) means for generating a set of e parity symbols associated with each information segment, where e is greater than one, where the mth parity symbol in said set associated with the ith segment is generated utilizing the following steps:
   i. selecting a set of W=kL information symbols $\{x_j[i-j-m-1], x_j[i-j-m-1-k], ..., x_j[i-j-m-1-k(L-1)]\}$, where j=0, 1, ..., k−1 and W is a defined window length and is a multiple of k and L is positive integer;
   ii. generating a codeword from said set of information symbols utilizing a systematic block code, where said block code corrects more than one erased symbol; and,
   iii. selecting the mth parity symbol from said codeword, where said parity symbol is denoted as $P_m[i-m-1]$, to be the mth parity symbol associated with the ith information segment;

c) means for assembling each of said information segments and its associated set of parity symbols into a sequence of packets, each of said packets comprising an information segment and its associated set of parity symbols; and, d) means for transmitting said sequence of packets to at least one receiver.

* * * * *